United States Patent [19]
Dydyk

[11] Patent Number: 5,210,507
[45] Date of Patent: May 11, 1993

[54] METHOD AND APPARATUS FOR HARMONIC REACTION AMPLIFIER VIA DIRECTIONAL FILTER

[75] Inventor: Michael Dydyk, Scottsdale, Ariz.

[73] Assignee: Motorola, Inc., Schaumburg, Ill.

[21] Appl. No.: 817,031

[22] Filed: Jan. 3, 1992

[51] Int. Cl.⁵ .............................................. H03F 3/60
[52] U.S. Cl. .................................... 330/286; 330/295
[58] Field of Search ................. 330/55, 124 D, 124 R, 330/286, 295, 306; 333/109

[56] References Cited

U.S. PATENT DOCUMENTS

| | | | |
|---|---|---|---|
| 2,942,209 | 6/1960 | Cohn | 333/10 |
| 3,781,718 | 12/1973 | Gittinger | 333/11 |
| 4,772,856 | 9/1988 | Nojima et al. | 330/251 |
| 5,083,094 | 1/1992 | Forsberg | 330/124 D X |

OTHER PUBLICATIONS

An article entitled "Harmonic Reaction Amplifier: A Novel High-Efficiency and High-Power Microwave Amplifier" by S. Nishiki & T. Nojima, 1987 *IEEE MTT-S Digest*, Copyright 1987, pp. 963–966.
An article entitled "High Efficiency Microwave Harmonic Reaction Amplifier" by T. Nojima & S. Nishiki, 1988 *IEEE MTT-S Digest*, copyright 1988, pp. 1007–1010.

*Primary Examiner*—Steven Mottola
*Attorney, Agent, or Firm*—Jeffrey D. Nehr

[57] ABSTRACT

A harmonic reaction amplifier (HRA) apparatus and method using a directional filter, including an HRA input for receiving an input signal, a divider coupled to the HRA input, the divider for splitting the input signal into a first divider signal and a second divider signal, an amplifier coupled to the divider, the amplifier for amplifying the first divider signal and the second divider signal, a directional filter coupled to the amplifier, the directional filter to filter the first and second divider signals to produce a filtered first divider signal and a filtered second divider signal, a combiner for combining the filtered first divider signal and the filtered second divider signal to produce an output signal, the combiner coupled to the directional filter, and an HRA output coupled to the combiner, the HRA output to receive the output signal from the combiner. The HRA can be used in a microwave radio.

16 Claims, 3 Drawing Sheets

METHOD AND APPARATUS FOR HARMONIC REACTION AMPLIFIER VIA DIRECTIONAL FILTER

CROSS REFERENCE TO RELATED APPLICATIONS

This invention relates to co-pending U.S. patent application Ser. No. 663,997 from the same inventive entity, having the same assignee.

BACKGROUND OF THE INVENTION

This invention relates in general to the field of amplifiers and in particular to microwave power amplifiers.

Microwave power amplifiers of increasing efficiency are important in many applications, including those related to radios. For example, in the field of mobile radio equipment, microwave power amplifiers with a high efficiency make it possible to reduce the size and power dissipation of radio transmitters.

By using class F amplification, an efficiency of about 70% has been achieved. The class F operation is performed under a special terminating condition in which the amplifier output terminal is short circuited at even harmonics and open-circuited at odd harmonics. Ideal switching is possible with such a configuration, resulting in 100% drain efficiency. Such high efficiency performance is possible only when using second harmonics in the amplifier.

For higher microwave frequencies, however, it is increasingly difficult to obtain high efficiencies, even with a class F amplifier. Construction to close tolerances and adjustment at the output termination are required to accurately establish the short circuit condition. In addition, class F amplifiers need to be biased to class AB, and therefore are not applicable to high power amplifier applications.

The harmonic reaction amplifier (HRA) is capable of realizing the terminating condition necessary for achieving ideal switching operation and can provide high efficiency at higher frequencies. The HRA achieves ideal class B operation with zero quiescent current without incurring efficiency losses. Output losses are kept to a minimum in a high efficiency and high power amplifier having over approximately 10 watts (W) of output power.

The HRA is described in Nishiki, S. and Nojima, T., "Harmonic Reaction Amplifier-a Novel High-Efficiency and High-Power Microwave Amplifier," IEEE MTT-S Digest, DD-5, pp. 963-966, 1987 and in Nishiki, S. and Nojima, T., "High Efficiency Microwave Harmonic Reaction Amplifier," IEEE MTT-S Digest, pp. 1007-1010, 1988. The HRA described by Nishiki and Nojima uses two signal reject filters and two second harmonic reject filters coupled with a variable second harmonic path. It would be desirable to simplify the Nishiki and Nojima HRA configuration, simplifying analysis and implementation. It would also be desirable to provide an improved method and apparatus for harmonic reaction amplification with lower insertion loss, resulting in a high efficiency of operation and a small size HRA.

SUMMARY OF THE INVENTION

Accordingly, it is an advantage of the present invention to provide a new and improved method and apparatus for providing a harmonic reaction amplifier. It is a further advantage of the present invention to provide an apparatus and method to provide for harmonic reaction amplification using a directional filter. It is still a further advantage of the present invention to provide for a harmonic reaction amplifier with lower insertion loss and consequently higher efficiency of operation.

To achieve these advantages, a harmonic reaction amplifier (HRA) apparatus using a directional filter is contemplated which includes an HRA input for an input signal, a divider coupled to the HRA input, the divider for splitting the input signal into a first divider signal and a second divider signal, an amplifier coupled to the divider, the amplifier for amplifying the first divider signal and the second divider signal, a directional filter coupled to the amplifier, the directional filter to filter the first divider signal and the second divider signal to produce a filtered first divider signal and a filtered second divider signal, a combiner for combining the filtered first divider signal and the filtered second divider signal to produce an output signal, the combiner coupled to the directional filter, and an HRA output coupled to the combiner, the HRA output to receive the output signal from the combiner.

In addition, a method for harmonic reaction amplification in a harmonic reaction amplifier is contemplated, the method comprising the steps of providing an input signal to an HRA input, dividing the input signal into a first divider signal and a second divider signal, amplifying the first divider signal and the second divider signal, filtering the first divider signal and the second divider signal in a directional filter to produce a filtered first divider signal and a filtered second divider signal, and combining the filtered first divider signal and the filtered second divider signal to produce an output signal at an HRA output.

The above and other features and advantages of the present invention will be better understood from the following detailed description taken in conjunction with the accompanying drawings.

DETAILED DESCRIPTION OF THE PRIOR ART

Figure 1:
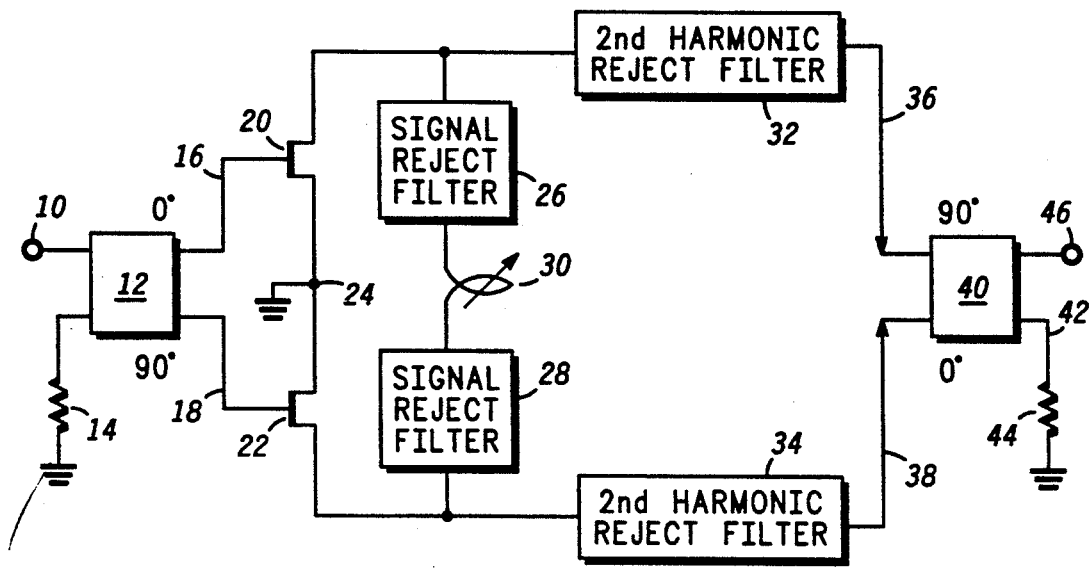
In FIG. 1, there is shown a circuit schematic of an HRA which is prior art.

FIG. 1 illustrates a circuit schematic of the HRA of Nishiki and Nojima described above. The FIG. 1 HRA includes an HRA input 10 coupled to a first input of divider 12. A second input of divider 12 is coupled through resistor 14 to electrical ground.

Divider 12 has a first output 16 coupled to the gate of field effect transistor (FET) 20. A second output 18 of divider 12 is coupled to the gate of a FET 22. The source of FET 20 and the source of FET 22 are coupled together at junction 24 and junction 24 is coupled to electrical ground. The drain of FET 20 is coupled to signal reject filter 26 and to second harmonic reject filter 32. The drain of FET 22 is coupled to signal reject filter 28 and to second harmonic reject filter 34.

Signal reject filter 26 is coupled through second harmonic resonance transmission path 30 to signal reject filter 28. Second harmonic reject filter 32 has an output 36 which forms a first input to combiner 40. Second harmonic reject filter 34 has an output 38 which forms a second input to combiner 40. Combiner 40 has an output 42 coupled through resistor 44 to electrical ground and a second output which is HRA output 46.

In operation, the Nishiki and Nojima HRA is very similar to a balanced amplifier. A critical difference, however, is the second harmonic resonance transmission path 30, with adjustable length, which is added between the two active elements (i.e., FETs 20 and 22) in the HRA. In addition, in the second harmonic resonance transmission path 30 there are two band rejection filters, i.e., signal reject filters 26 and 28, which reflect fundamental signal components. Also, second harmonic reject filters 32 and 34, acting as high impedance terminations for harmonic components, are inserted into the output signal path of divider 12 and combiner 40. Combiner 40, an in-phase output combiner, puts together the fundamental signals.

Given a signal to HRA input 10, divider 12 processes the input signal and produces a zero degree phase shift signal at output 16 which is sent to the gate of FET 20 and a 90 degree phase shift signal at output 18 which is sent to the gate of FET 22. Operation of the HRA in class B condition excites the second harmonic content of the signal, and power flows only in the second harmonic path. Second harmonic resonance transmission path 30 can be adjusted to excite a steadying wave and generate a magnetic wall condition at both active devices (FETs 20 and 22). The magnetic wall condition coincides with the ideal short-circuit condition with regard to second-harmonic output components.

The HRA therefore behaves as a push-pull amplifier with respect to second harmonics. FETs 20 and 22 inject second harmonic current into each other, causing current amplitude modulation in the output terminal of each active device. This results in increased switching operation efficiency of the converted fundamental and third order harmonic components of the original signal. The HRA achieves greater efficiency than the conventional class F amplifier even though it employs purely class B biased operation. The HRA gets its name because each active device's second harmonic current works as a reaction force to increase efficiency.

DETAILED DESCRIPTION OF THE PREFERRED EMBODIMENT

Figure 2:
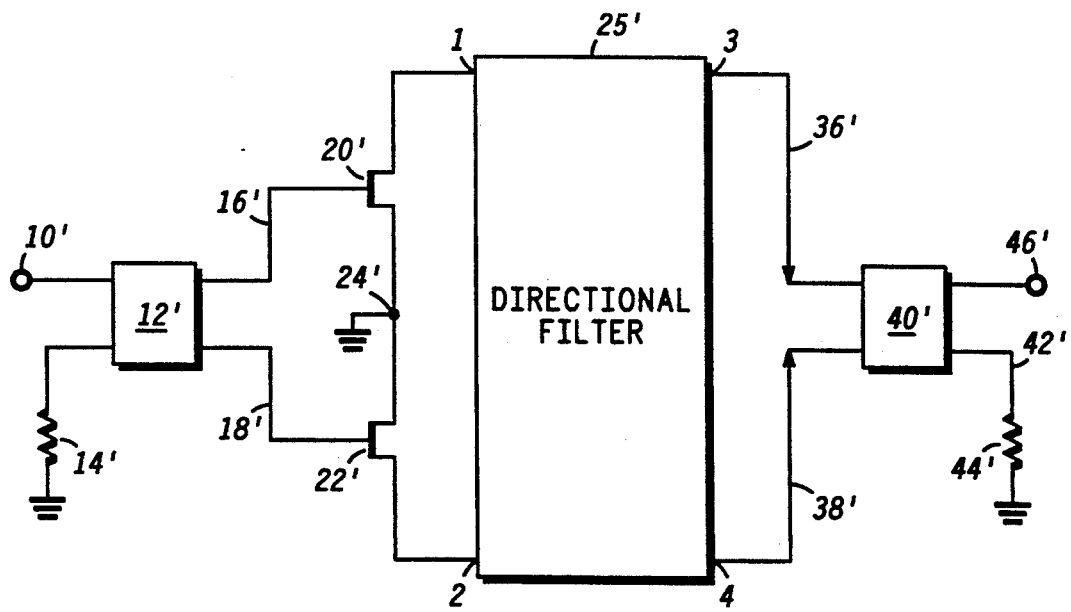
In FIG. 2, there is shown a circuit schematic of an HRA in accordance with a preferred embodiment of the invention.

FIG. 2 illustrates a circuit schematic of an HRA in accordance with a preferred embodiment of the invention. Inspection of FIG. 2 in comparison to FIG. 1 shows corresponding components with reference numerals including "prime" designations (e.g., divider 12' in FIG. 2 corresponds to divider 12 in FIG. 1). Thus, the FIG. 2 HRA includes an HRA input 10' coupled to a first input of divider 12'. A second input to divider 12' is coupled through resistor 14' to electrical ground.

FIG. 2 illustrates the use of field effect transistors (FETs) as active devices in the HRA. Other active devices such as Gunn diodes, IMPATT diodes, or field emission devices can be substituted for FETs in the HRA.

Divider 12' has a first output 16' coupled to the gate of FET 20'. A second output 18' of divider 12' is coupled to the gate of a FET 22'. The source of FET 20' and the source of FET 22' are coupled together at junction 24' and junction 24' is coupled to electrical ground.

The drain of FET 20' in FIG. 2 is coupled to port 1 of directional filter 25'. The drain of FET 22' is coupled to port 2 of directional filter 25'. The output 36' from port 3 of directional filter 25' forms a first input to combiner 40'. Similarly, the output 38' from port 4 of directional filter 25' forms a second input to combiner 40'. Combiner 40' has an output 42' coupled through resistor 44' to electrical ground and a second output which is HRA output 46' for the HRA in FIG. 2.

Thus, the FIG. 2 HRA differs with respect to the FIG. 1 HRA in that it replaces the combination of signal reject filters 26 and 28, second harmonic resonance transmission path 30, and second harmonic reject filters 32 and 34 in FIG. 1 with directional filter 25' in FIG. 2.

A directional filter such as directional filter 25' is a four port structure. The performance characteristics of a directional filter are that the structure behaves as a band pass filter with minimum loss between the first and second ports and as a band reject filter with maximum loss between the first and fourth ports at a resonant frequency. The amount of rejection decreases and in theory approaches zero as the frequency of the signal becomes far from the resonant frequency.

By designing a directional filter to operate at the second harmonic of the input frequency to the amplifier, the requirements of the HRA can be satisfied. Thus, the HRA described provides minimum loss in the fundamental and second harmonic paths while isolating the appropriate ports, and directional filter 25' in FIG. 2 functionally replaces signal reject filters 26 and 28, second harmonic resonance transmission path 30, and second harmonic reject filters 32 and 34 in FIG. 1 to produce an HRA.

Figure 3:
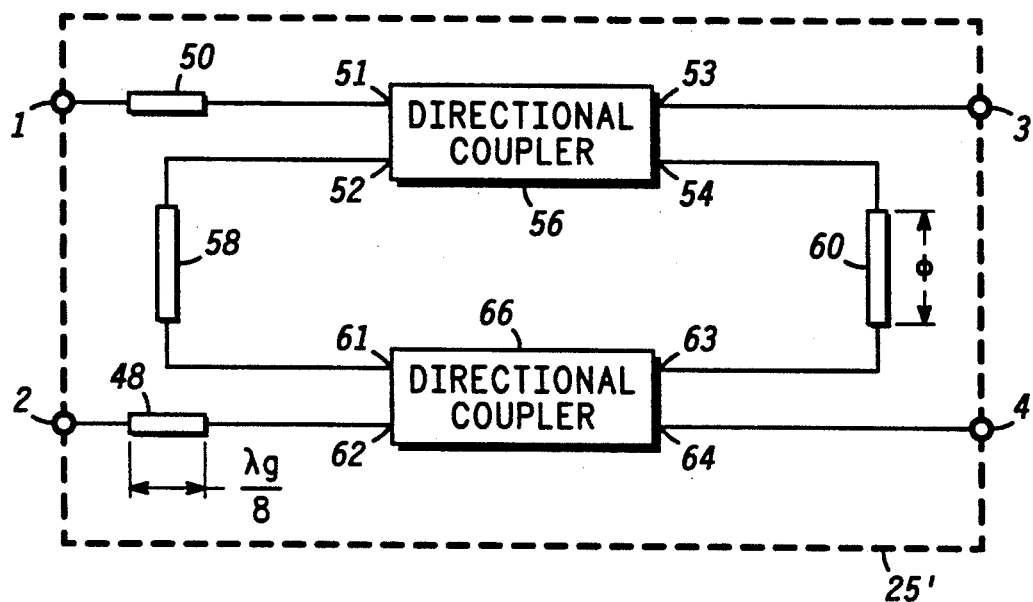
In FIG. 3, there is shown a diagram of a directional filter which can be used to realize the HRA of FIG. 2.

Directional filter 25' in FIG. 2 can be realized via two combined directional couplers, as illustrated by directional couplers 56 and 66 as key components of directional filter 25' in FIG. 3. Analysis can then be performed on the combined directional coupler approach to the directional filter in the HRA using scattering parameters $S_{12}$ and $S_{14}$.

Directional filter scattering parameters $S_{12}$ and $S_{14}$ are defined in terms of directional coupler scattering parameters $s_{12}$ and $s_{14}$. Directional coupler scattering parameters $s_{12}$ and $s_{14}$ themselves depend on the following:

$\theta$, which is the electrical length of the directional filter;

k, which is directional coupler coupling coefficient;

n, which is the number of interconnect quarter wavelengths between the directional couplers; and $\phi$, which is the electrical length of the interconnect between the directional couplers and is equal to $(\pi/2)(2n-1)$.

In terms of the quantities defined:

$$S_{12} = \frac{s_{12}^2 \exp(-j\phi)}{1 - [s_{14}\exp(-j\phi)]^2} \qquad \text{Eqn. 1}$$

$$S_{14} = s_{14}[1 + S_{12}\exp(-j\phi)] \qquad \text{Eqn. 2}$$

-continued where $$s_{12} = \frac{jk\sin\theta}{\sqrt{1-k^2}\cos\theta + j\sin\theta} \quad \text{Eqn. 3}$$

$$s_{14} = \frac{\sqrt{1-k^2}}{\sqrt{1-k^2}\cos\theta + j\sin\theta} \quad \text{Eqn. 4}$$

For a 10 decibel (dB) directional coupler, $k=0.316$. Assuming $\theta=\pi/2$ and $n=1$ in the above equations yields:

$$S_{12} = 0 \text{ dB at the second harmonic} \quad \text{Eqn. 5}$$

and $$S_{14} = 0.225 \text{ dB at the fundamental frequency} \quad \text{Eqn. 6}$$

It is possible to reduce the insertion loss at the fundamental frequency further by reducing $k$, $\theta$, or increasing $n$.

The HRA in FIG. 1 provides a phase length adjustment in the second harmonic resonance transmission path 30 in order to provide a short circuit at an active device terminal. This is not necessary in the directional filter approach to the HRA in FIG. 2 because the transmission phase of the second harmonic path can be determined a priori. Recognizing that the directional filter will be even mode excited by the active devices (FETs 20' and 22' in FIG. 2), the reflection coefficient is given by:

$$\Gamma_e = \frac{s_{12}^2 \exp(-j\phi)}{1-(s_{14}\exp(-j\phi))^2} \quad \text{Eqn. 7}$$

Evaluating equation 7 with the previous results produces:

$$\Gamma_e = \exp\left(-j\frac{\pi}{2}\right) \quad \text{Eqn. 8}$$

For a short circuit at device terminals at the second harmonic, it is necessary to have:

$$\Gamma_e = -1 \quad \text{Eqn. 9}$$

which suggests that a length of transmission line has to be added between each directional coupler and each active device in the FIG. 3 case. The added length is determined to be:

$$L_\gamma = \frac{\lambda_g}{8} \quad \text{Eqn. 10}$$

where $L_\gamma$ is the added length and $\lambda_g$ is the wavelength of the signal at the fundamental frequency.

In detail, the directional filter 25' of FIG. 3 comprises ports 1,2,3, and 4. Port 1 is coupled through transmission line 50 to port 51 of directional coupler 56. Port 52 of directional coupler 56 is coupled through transmission line 58 to port 61 of directional coupler 66.

Port 2 of directional filter 25' is coupled through transmission line 48 to port 62 of directional coupler 66. Note that both transmission line 48 and transmission line 50 are of the length given in equation 10.

Port 54 of directional coupler 56 is coupled through transmission line 60 to port 63 of directional coupler 66. Port 53 of directional coupler 56 is coupled to port 3 of directional filter 25', and port 64 of directional coupler 66 is coupled to port 4 of directional filter 25'. Note that both transmission line 58 and transmission line 60 are of length $\phi$.

Figure 4:
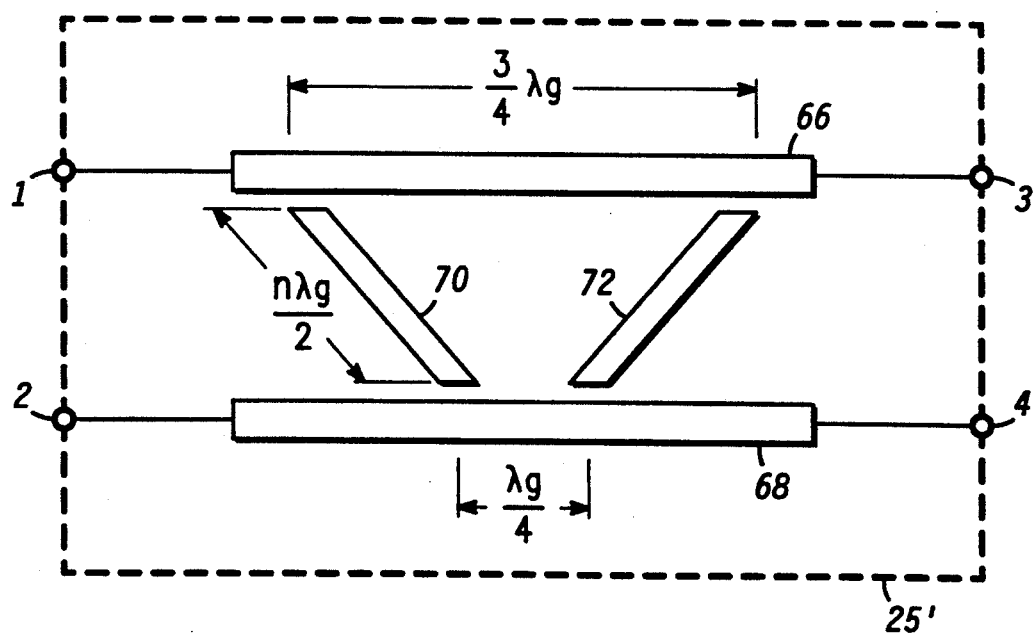
In FIG. 4, there is shown a diagram of a second directional filter which can be used to realize the HRA of FIG. 2.

FIG. 4 shows an alternate embodiment of a directional filter 25' which can also be used to achieve a directional filter HRA as shown in FIG. 2. The FIG. 4 directional filter 25' uses only transmission line components and would therefore be larger than the directional filter 25' in FIG. 3 because of associated line requirements.

In detail, the directional filter 25' of FIG. 4 comprises transmission lines 66, 68, 70, and 72 and uses a one-half wave resonator approach. Linear transmission line 66 is coupled between directional filter 25' ports 1 and 3. Linear transmission line 68, parallel to transmission line 66, is coupled between directional filter 25' ports 2 and 4. Transmission lines 70 and 72, equal in length to each other and to one-half an integral number of the wavelength of a fundamental of the input signal, are positioned symmetrically and obliquely with respect to parallel transmission lines 66 and 68 to nearly span the gap between between transmission lines 66 and 68 and placed so that the ends of transmission lines 70 and 72 are spaced by a distance of three-fourths the wavelength of the fundamental of the input signal along transmission line 66 and spaced by a distance of one-fourth the wavelength of the fundamental of the input signal along transmission line 68.

Figure 5:
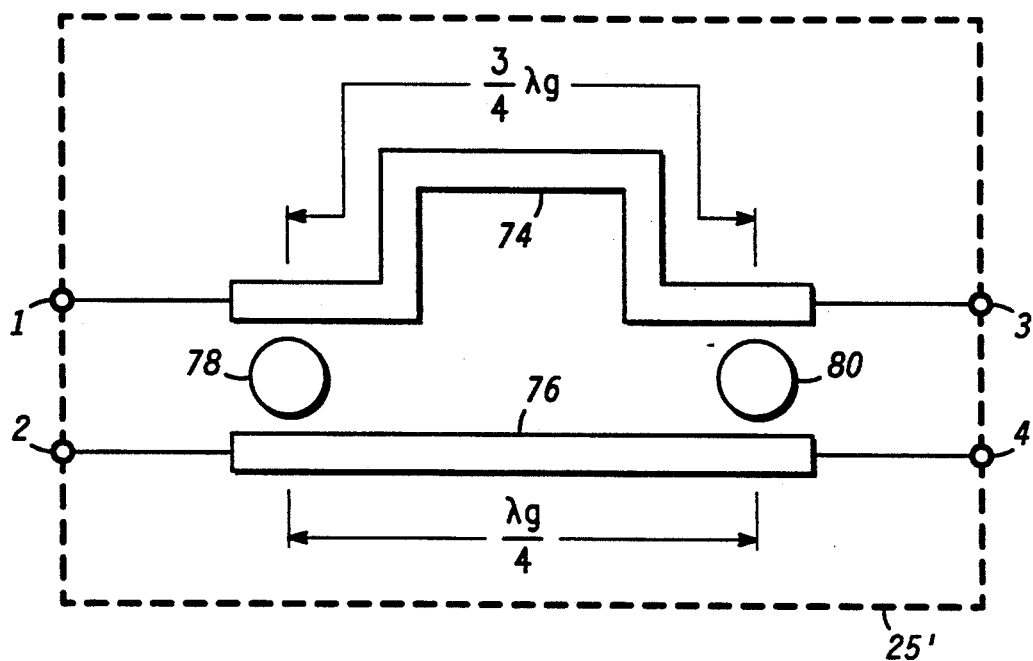
In FIG. 5, there is shown a diagram of a third directional filter which can be used to realize the HRA of FIG. 2; and In FIG. 6, there is shown a schematic diagram of an HRA in accordance with a preferred embodiment of the invention in a radio.

FIG. 5 shows an additional alternate embodiment of a directional filter 25' which can be used to achieve a directional filter HRA as shown in FIG. 2. The directional filter in FIG. 5 replaces the one-half wave resonators of FIG. 4 with dielectric resonators.

The FIG. 5 directional filter 25' includes transmission line 74, which is coupled between ports 1 and 3 of directional filter 25', and transmission line 76, which is coupled between ports 2 and 4 of directional filter 25'. Transmission line 76 is linear, and transmission line 74 is in an "U" shape with transmission line extensions proceeding laterally outward from the line of symmetry of the "U" shape in the open end of the "U" such that the transmission line extensions are oriented parallel to transmission line 74. The bend in the "U" is oriented away from transmission line 76 and the "U" is comprised of right angled bends so that the "base" of the "U" is a linear portion of transmission line 74 parallel to transmission line 76. Dielectric resonators 78 and 80 are centered between the transmission line extensions of transmission line 74 and transmission line 76 in the space between parallel portions of transmission line 74 and transmission line 76 such that the center to center spacing of dielectric resonators 78 and 80 measured along transmission line 76 is one-fourth the wavelength of the signal at the fundamental frequency and that same spacing measured along the "U" bend of transmission line 74 is three-fourths the wavelength of the signal at the fundamental frequency.

The directional filter in the HRA can also be realized in a lumped element configuration as described in co-pending U.S. patent application Ser. No. 663,997 from the same inventive entity, having the same assignee.

Figure 6:
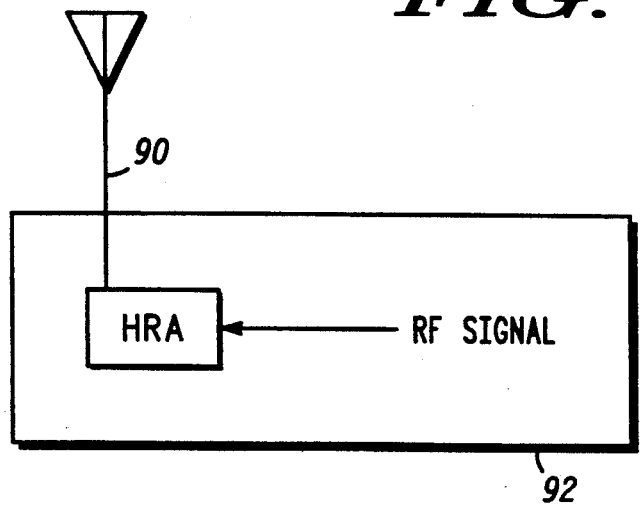

FIG. 6 illustrates schematically the use of an HRA in a radio in accordance with a preferred embodiment of the invention. Antenna 90 is coupled to radio 92. The HRA is a component of the radio 92. The antenna 90 transmits a signal which can be amplified in the HRA.

Thus, a new method and apparatus for providing a harmonic reaction amplifier using a directional filter has been described which overcomes specific problems and accomplishes certain advantages relative to prior art methods and mechanisms. The improvements over known technology are significant. The HRA described provides a new and improved method and apparatus for providing a harmonic reaction amplifier. Harmonic reaction amplification can be accomplished in a simple manner using a directional filter and transmission line combination. The HRA achieved exhibits lower insertion loss and a high efficiency of operation and can be constructed using a number of directional filter operation and can be constructed using a number of directional filter embodiments. The HRA is therefore suitable for use in a wide variety of applications, including microwave radio systems.

Thus, there has also been provided, in accordance with an embodiment of the invention, a new method and apparatus for providing a harmonic reaction amplifier using a directional filter that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A harmonic reaction amplifier (HRA) comprising:
an HRA input for receiving an input signal;
means for dividing the input signal into a first divider signal comprising a zero degree phase shift signal and a second divider signal comprising a ninety degree phase shift signal, the means for dividing coupled to the HRA input;
means for amplifying the first divider signal and the second divider signal coupled to the means for dividing;
a directional filter to filter the first divider signal and the second divider signal to produce a filtered first divider signal and a filtered second divider signal, wherein the directional filter (DF) comprises: first, second, third, and fourth DF ports; a first transmission line coupled between the first DF port and a first port of a first directional coupler (DC); a second transmission line coupled between the second port of the DF and a second port of a second DC; a third transmission line coupled between a second port of the first DC and a first port of the second DC; a third port of the first DC coupled to the third DF port; a fourth transmission line coupled between a fourth port of the first DC and a third port of the second DC; and a fourth port of the second DC coupled to the fourth DF port; and
means for combining the filtered first divider signal and the filtered second divider signal to produce an output signal at an HRA output, the means for combining coupled to the directional filter.

2. An HRA as claimed in claim 1, wherein the length of each of the first and second transmission lines is one-eighth of a wavelength of a fundamental of the input signal.

3. A harmonic reaction amplifier (HRA) comprising:
an HRA input for receiving an input signal;
means for dividing the input signal into a first divider signal comprising a zero degree phase shift signal and a second divider signal comprising a ninety degree phase shift signal, the means for dividing coupled to the HRA input;
means for amplifying the first divider signal and the second divider signal coupled to the means for dividing;
a directional filter to filter the first divider signal and the second divider signal to produce a filtered first divider signal and a filtered second divider signal, wherein the directional filter (DF) comprises: first, second, third, and fourth DF ports; a first transmission line coupled between the first DF port and the third DF port; a second transmission line parallel to the first transmission line, the second transmission line coupled between the second DF port and the fourth DF port; and third and fourth transmission lines, equal in length to each other and to one-half an integral number of the wavelength of a fundamental frequency of the input signal, wherein the third and fourth transmission lines are placed symmetrically and non-perpendicularly to nearly span a gap between the first and second transmission lines so as to be spaced by a first distance of three-fourths the wavelength of the fundamental frequency of the input signal along the first transmission line and to be spaced by a second distance of one-fourth the wavelength of the fundamental frequency of the input signal along the second transmission line; and
means for combining the filtered first divider signal and the filtered second divider signal to produce an output signal at an HRA output, the means for combining coupled to the directional filter.

4. A harmonic reaction amplifier (HRA) comprising:
an HRA input for receiving an input signal;
means for dividing the input signal into a first divider signal comprising a zero degree phase shift signal and a second divider signal comprising a ninety degree phase shift signal, the means for dividing coupled to the HRA input;
means for amplifying the first divider signal and the second divider signal coupled to the means for dividing;
a directional filter to filter the first divider signal and the second divider signal to produce a filtered first divider signal and a filtered second divider signal, wherein the directional filter (DF) comprises: first, second, third, and fourth DF ports; a first linear transmission line coupled between the second and the fourth DF ports; a second transmission line coupled between the first DF port and the third DF port, wherein the second transmission line is "U" shaped with first and second transmission line extensions extending laterally outward from an open end of the "U" and from a center line of symmetry of the "U" such that the first and second transmission line extensions are parallel to the first linear transmission line; and first and second dielectric resonators centered between the first transmission line extensions of the second transmission line and the first linear transmission line such that a first center to center spacing of the first and second dielectric resonators along the first linear transmission line is one-fourth a wavelength of a fundamental frequency of the input signal and that a second center to center spacing measured along the second transmission line is three-fourths the wavelength of the fundamental frequency of the input signal; and means for combining the filtered first divider signal and the filtered second divider signal to produce an output signal at an HRA output, the means for combining coupled to the directional filter.

5. A high efficiency, microwave signal amplifier in a microwave radio system, the amplifier comprising:

an amplifier input for an input signal;

means for dividing the input signal into a first divider signal comprising a zero degree phase signal and a second divider signal comprising a ninety degree phase signal, the means for dividing coupled to the amplifier input;

means for amplifying the first divider signal and the second divider signal, the means for amplifying coupled to the means for dividing;

a directional filter to filter the first divider signal and the second divider signal to produce a filtered first divider signal and a filtered second divider signal, the directional filter coupled to the means for amplifying and comprising: first, second, third, and fourth DF ports; a first transmission line coupled between the first DF port and a first port of a first directional coupler (DC); a second transmission line coupled between the second port of the DF and a second port of a second DC; a third transmission line coupled between a second port of the first DC and a first port of the second DC; a third port of the first DC coupled to the third DF port; a fourth transmission line coupled between a fourth port of the first DC and a third port of the second DC; and a fourth port of the second DC coupled to the fourth DF port; and means for combining the filtered first divider signal and the filtered second divider signal to produce an output signal at an amplifier output, the means for combining coupled to the directional filter.

6. An amplifier as claimed in claim 5, wherein the length of each of the first and second transmission lines is one-eighth of a wavelength of a fundamental frequency of the input signal.

7. A high efficiency, microwave signal amplifier in a microwave radio system, the amplifier comprising:

an amplifier input for an input signal;

means for dividing the input signal into a first divider signal comprising a zero degree phase signal and a second divider signal comprising a ninety degree phase signal, the means for dividing coupled to the amplifier input;

means for amplifying the first divider signal and the second divider signal, the means for amplifying coupled to the means for dividing;

a directional filter to filter the first divider signal and the second divider signal to produce a filtered first divider signal and a filtered second divider signal, the directional filter coupled to the means for amplifying and comprising: first, second, third, and fourth DF ports; a first transmission line coupled between the first DF port and the third DF port; a second transmission line parallel to the first transmission line, the second transmission line coupled between the second DF port and the fourth DF port; and third and fourth transmission lines, equal in length to each other and to one-half an integral number of the wavelength of a fundamental frequency of the input signal, wherein the third and fourth transmission lines are placed symmetrically and non-perpendicularly to nearly span a gap between the first and second transmission lines so as to be spaced by a first distance of three-fourths the wavelength of the fundamental frequency of the input signal along the first transmission line and to be spaced by a second distance of one-fourth the wavelength of the fundamental frequency of the input signal along the second transmission line; and means for combining the filtered first divider signal and the filtered second divider signal to produce an output signal at an amplifier output, the means for combining coupled to the directional filter.

8. A high eficiency, microwave signal amplifier in a microwave radio system, the amplifier comprising:

an amplifier input for an input signal;

means for dividing the input signal into a first divider signal comprising a zero degree phase signal and a second divider signal comprising a ninety degree phase signal, the means for dividing coupled to the amplifier input;

means for amplifying the first divider signal and the second divider signal, the means for amplifying coupled to the means for dividing;

a directional filter to filter the first divider signal and the second divider signal to produce a filtered first divider signal and a filtered second divider signal, the directional filter coupled to the means for amplifying and comprising: first, second, third, and fourth DF ports; a first linear transmission line coupled between the second and the fourth DF ports; a second transmission line coupled between the first DF port and the third DF port, wherein the second transmission line is configured "U" shaped with first and second transmission line extensions extending laterally outward from a center line of symmetry of the "U" at an open end of the "U" such that the first and second transmission line extensions are parallel to the first linear transmission line; and first and second dielectric resonators centered between the first transmission line extensions of the second transmission line and the first linear transmission line such that a first center to center spacing of the first and second dielectric resonators along the first linear transmission line is one-fourth a wavelength of a fundamental frequency of the input signal and that a second center to center spacing measured along the second transmission line is three-fourths the wavelength of the fundamental frequency of the input signal; and means for combining the filtered first divider signal and the filtered second divider signal to produce an output signal at an amplifier output, the means for combining coupled to the directional filter.

9. A radio having a high efficiency, microwave signal amplifier, the amplifier comprising:

an amplifier input for an input signal;

means for dividing the input signal into a first divider signal and a second divider signal, the means for dividing coupled to the amplifier input, wherein the first divider signal comprises a zero degree phase signal and the second divider signal comprises a ninety degree phase shift signal, each with respect to the input signal;

means for amplifying the first divider signal and the second divider signal, the means for amplifying coupled to the means for dividing;

a directional filter to filter the first divider signal and the second divider signal to produce a filtered first divider signal and a filtered second divider signal, the directional filter coupled to the means for amplifying;

means for combining the filtered first divider signal and the filtered second divider signal to produce an output signal, the means for combining coupled to the directional filter; and an amplifier output coupled to the means for combining, the amplifier output to receive the output signal from the means for combining.

10. A radio as claimed in claim 9, wherein the means for amplifying comprises:

a first transistor coupled to the means for dividing and to the directional filter; and a second transistor coupled to the means for dividing, to the directional filter, and to the first transistor.

11. A radio as claimed in claim 9, wherein the means for amplifying comprises:

a first field effect transistor (FET) including a gate, source, and drain, wherein the gate is coupled to the means for dividing to receive the zero degree phase signal, the source is coupled to electrical ground, and the drain is coupled to the directional filter to provide the zero degree phase signal to the directional filter; and a second FET including a gate, source, and drain, wherein the gate is coupled to the means for dividing to receive the ninety degree phase signal, the source is coupled to electrical ground, and the drain is coupled to the directional filter to provide the ninety degree phase signal to the directional filter.

12. A radio as claimed in claim 9, wherein the directional filter (DF) comprises:

first, second, third, and fourth DF ports;

a first transmission line coupled between the first DF port and a first port of a first directional coupler (DC);

a second transmission line coupled between the second port of the DF and a second port of a second DC;

a third transmission line coupled between a second port of the first DC and a first port of the second DC;

a third port of the first DC coupled to the third DF port;

a fourth transmission line coupled between a fourth port of the first DC and a third port of the second DC; and a fourth port of the second DC coupled to the fourth DF port.

13. A radio as claimed in claim 12, wherein the length of each of the first and second transmission lines is one-eighth of a wavelength of a fundamental frequency of the input signal.

14. A radio as claimed in claim 9, wherein the directional filter (DF) comprises:

first, second, third and fourth DF ports;

a first transmission line coupled between the first DF port and th third DF port;

a second transmission line parallel to the first transmission line, the second transmission line coupled between the second DF port and the fourth DF port; and third and fourth transmission lines, equal in length to each other and to one-half an integral number of the wavelength of a fundamental frequency of the input signal, wherein the third and fourth transmission lines are placed symmetrically and non-perpendicularly to nearly span a gap between the first and second transmission lines so as to be spaced by a first distance of three-fourths the wavelength of the fundamental frequency of the input signal along the first transmission line and to be spaced by a second distance of one-fourth the wavelength of the fundamental frequency of the input signal along the second transmission line.

15. A radio as claimed in claim 9, wherein the directional filter (DF) comprises:

first, second, third and fourth DF ports;

a first linear transmission line coupled between the second and the fourth DF ports;

a second transmission line coupled between the first DF port and the third DF port, wherein the second transmission line is configured "U" shaped with first and second transmission line extensions extending laterally outward from a center line of symmetry of the "U" at an open end of the "U" such that the first and second transmission line extensions are parallel to the first linear transmission line; and first and second dielectric resonators centered between the first transmission line extensions of the second transmission line and the first linear transmission line such that a first center to center spacing of the first and second dielectric resonators along the first linear transmission line is one-fourth a wavelength of a fundamental frequency of the input signal and that a second center to center spacing measured along the second transmission line is three-fourths the wavelength of the fundamental frequency of the input signal.

16. A harmonic reaction amplifier as claimed in claim 1, wherein the means for amplifying comprises:

a first field effect transistor (FET) including a gate, source, and drain, wherein the gate is coupled to the means for dividing to receive the zero degree phase signal, the source is coupled to electrical ground, and the drain is coupled to the directional filter to provide the zero degree phase signal to the directional filter; and a second FET including a gate, source, and drain, wherein the gate is coupled to the means for dividing to receive the ninety degree phase signal, the source is coupled to electrical ground, and the drain is coupled to the directional filter to provide the ninety degree phase signal to the directional filter.

* * * * *